US009541395B2

(12) United States Patent
Fell

(10) Patent No.: US 9,541,395 B2
(45) Date of Patent: Jan. 10, 2017

(54) STRAIN DECOUPLED SENSOR

(71) Applicant: Atlantic Inertial Systems Limited, Devon (GB)

(72) Inventor: Christopher Paul Fell, Devon (GB)

(73) Assignee: Atlantic Inertial Systems Limited, Plymouth (GB)

( * ) Notice: Subject to any disclaimer, the term of this patent is extended or adjusted under 35 U.S.C. 154(b) by 16 days.

(21) Appl. No.: 14/369,874

(22) PCT Filed: Jan. 4, 2013

(86) PCT No.: PCT/GB2013/050006
§ 371 (c)(1),
(2) Date: Jun. 30, 2014

(87) PCT Pub. No.: WO2013/102763
PCT Pub. Date: Jul. 11, 2013

(65) Prior Publication Data
US 2015/0028437 A1    Jan. 29, 2015

(30) Foreign Application Priority Data

Jan. 5, 2012 (GB) .................................. 1200128.5

(51) Int. Cl.
*G01C 19/5684* (2012.01)
*B81B 7/00* (2006.01)
*G01C 19/5783* (2012.01)
*B81B 3/00* (2006.01)

(52) U.S. Cl.
CPC ......... *G01C 19/5684* (2013.01); *B81B 3/0021* (2013.01); *B81B 7/0048* (2013.01); *G01C 19/5783* (2013.01); *B81B 2201/0242* (2013.01)

(58) Field of Classification Search
CPC .............. G01C 19/5684; G01C 19/5783; B81B 3/0021; B81B 7/0048; B81B 2201/0242
See application file for complete search history.

(56) References Cited

U.S. PATENT DOCUMENTS 6,137,170 A * 10/2000 Ujiie ..................... H01L 23/13
257/697
6,282,958 B1 * 9/2001 Fell ..................... G01C 19/5684
73/504.13
(Continued)

FOREIGN PATENT DOCUMENTS

CN        1701438        11/2005
CN       102089620        6/2011
(Continued)

OTHER PUBLICATIONS

International Search Report and Written Opinion for PCT/GB2013/050006 dated May 3, 2013.
(Continued)

*Primary Examiner* — Dale E Page
*Assistant Examiner* — Vincent Wall
(74) *Attorney, Agent, or Firm* — Snell & Wilmer L.L.P.

(57) ABSTRACT

A sensor comprises a substrate (16) and a sensor element (20) anchored to the substrate (16), the substrate (16) and sensor element (20) being of dissimilar materials and having different coefficients of thermal expansion, the sensor element (20) and substrate (16) each having a generally planar face arranged substantially parallel to one another, the sensor further comprising a spacer (26), the spacer (26) being located so as to space at least part of the sensor element (20) from at least part of the substrate (16), wherein the spacer (26) is of considerably smaller area than the area of the smaller of face of the substrate (16) and that of the sensor element (20).

12 Claims, 3 Drawing Sheets

(56) References Cited

U.S. PATENT DOCUMENTS

| | | |
|---|---|---|
| 6,787,804 B1 | 9/2004 | Yang |
| 2003/0038415 A1 | 2/2003 | Anderson et al. |
| 2004/0144174 A1* | 7/2004 | Fell .................. G01C 19/5684 73/504.12 |
| 2005/0035446 A1* | 2/2005 | Karpman et al. ............. 257/711 |
| 2010/0030020 A1 | 2/2010 | Ge et al. |
| 2010/0072563 A1 | 3/2010 | Sato et al. |
| 2010/0251818 A1 | 10/2010 | Ge et al. |
| 2011/0167911 A1* | 7/2011 | Fell .................. G01C 19/5684 73/504.12 |

FOREIGN PATENT DOCUMENTS

| | | |
|---|---|---|
| EP | 1427988 | 7/2011 |
| JP | 2006518673 | 8/2006 |
| JP | 2008516196 | 5/2008 |
| JP | 2011528103 | 11/2011 |
| WO | 2008069394 | 6/2008 |

OTHER PUBLICATIONS

Search report for United Kingdom application GB1200128.5 dated May 4, 2012.

Office Action dated Jul. 17, 2015 in Chinese Application No. 201380004817.X.

European Search Report dated Oct. 5, 2015 in European Application No. 13700783.7.

Office Action dated Apr. 5, 2016 in Chinese Application No. 201380004817.X.

Office Action dated Apr. 22, 2016 in Japanese Application No. 2014-550758.

* cited by examiner

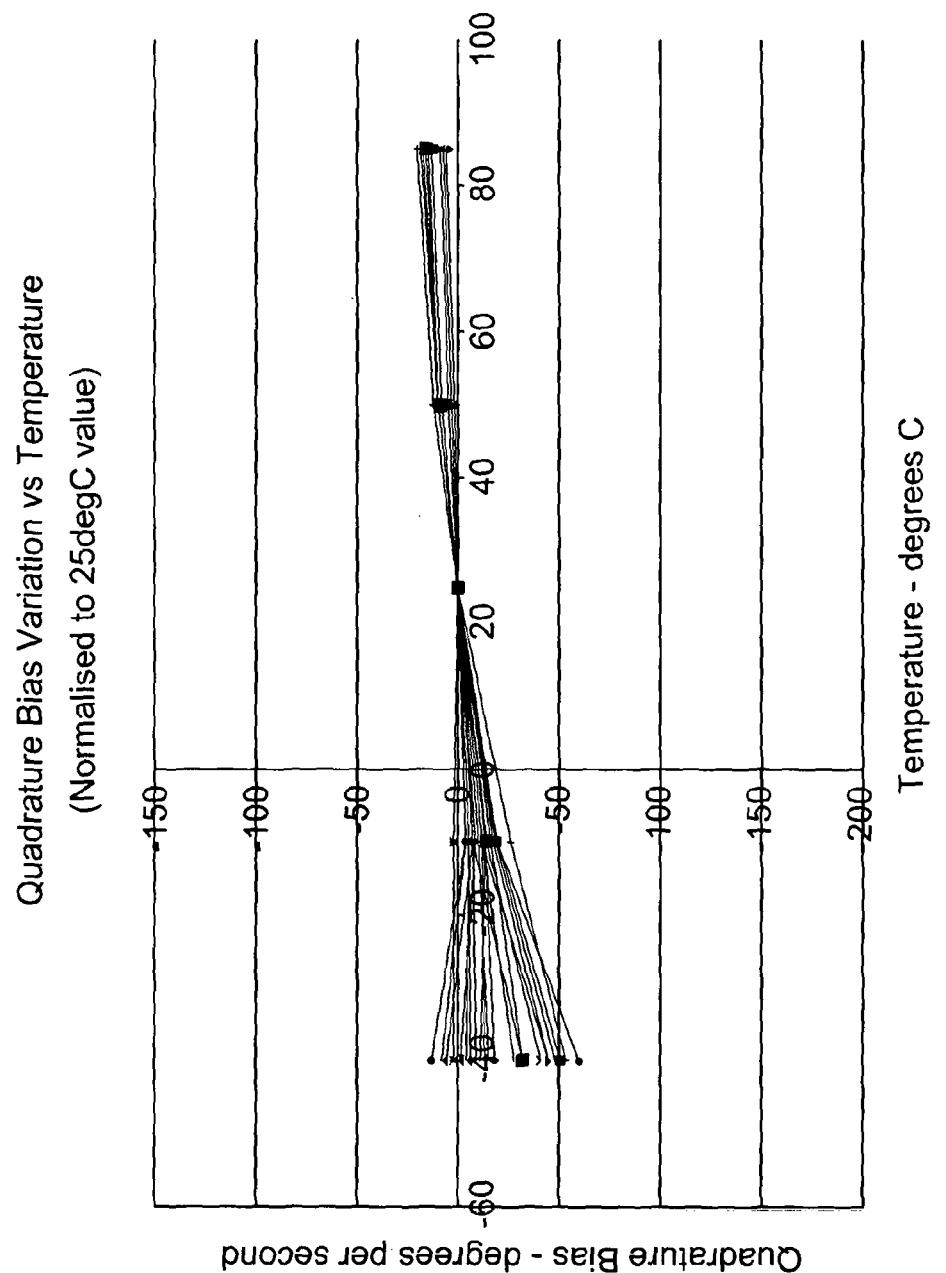

STRAIN DECOUPLED SENSOR

CROSS-REFERENCE TO RELATED APPLICATIONS

This application is U.S. national phase filing under 35 U.S.C. §371 of PCT/GB2013/050006 filed on Jan. 1, 2013, and claims priority from United Kingdom Application No. GB 1200128.5 which was filed on Jan. 5, 2012, both of which are incorporated herein by reference.

This invention relates to a sensor, and in particular to a sensor in which inaccuracies arising from thermally induced stresses are reduced.

Sensors are typically composed of a number of component parts at least some of which are of different materials and which are rigidly interconnected to one another. If the sensor is subject to a change in temperature, then thermal expansion or contraction of each component part will occur. Where the component parts have different coefficients of thermal expansion, as will often be the case where the component parts are of different materials, then stresses will typically be induced.

Micro-electromechanical systems (MEMS) technology has been used to create a number of sensor designs. For example, MEMS based accelerometers and gyroscopes are well known. Such devices typically comprise a substantially planar silicon layer anchored to a substrate of, for example, glass or silicon. Other components may also be anchored to the substrate, and differential thermal expansion, as mentioned above, between the said other components and the substrate may induce stresses in the silicon layer which, in turn, can impact negatively upon the operation of the sensor. For example, the bias or scale factor of the sensor may be impacted.

US2010/0072563 and WO2008/069394 describe sensor arrangements in which a sensor element is bonded to a substrate. In each case, the sensor element includes movable parts movable relative to fixed parts, and whilst only the fixed parts of the sensor element, not the entire surface of the sensor element, are bonded to the substrate, as several parts of the sensor element are bonded to the substrate, differential thermal expansion or contraction results in stresses being induced in the sensor element.

US2010/0251818 and US2010/0300201 describe an arrangement in which a resilient or compliant support is used to support a sensor element, accommodating differential thermal expansion.

US2003/0038415 describes a mounting arrangement for a sensor and which is compliant.

It is an object of the invention to provide a sensor in which the disadvantages outlined hereinbefore are overcome or are of reduced effect.

According to the present invention there is provided a sensor comprising a substrate and a sensor element anchored to the substrate, the substrate and sensor element being of dissimilar materials and having different coefficients of thermal expansion, the sensor element and substrate each having a generally planar face arranged substantially parallel to one another, the sensor further comprising a single spacer whereby the sensor element is anchored to the substrate, the spacer being located so as to space at least part of the sensor element from at least part of the substrate, wherein the spacer is of considerably smaller area than the area of the smaller of the face of the substrate and that of the sensor element.

The spacer may be formed integrally with one or other, or both, of the sensor element and the substrate. Where the spacer is formed integrally with one of the sensor element and the substrate, it is conveniently bonded, for example using a suitable Epoxy, to the other of the sensor element and the substrate. It will be appreciated that the area of contact between the spacer and the said other of the sensor element and the substrate, i.e. the area of the spacer, is considerably smaller than the area of the face of that component.

As, in this arrangement, the sensor element and substrate are only interconnected over a small proportion of their areas, at the location of the spacer, stresses arising from differential thermal expansion of the sensor element and substrate are limited to those due to the small proportion of the areas at which they are interconnected, at the spacer, and so are of much reduced impact upon the operation of the sensor.

Conveniently, the spacer is formed integrally with the substrate. For example, it may be defined by a small diameter projection, upstanding from the surrounding part of the substrate. A cavity may be formed in the face of the substrate, the projection preferably being located at the centre of the cavity. The cavity is conveniently of annular form.

The projection is conveniently of generally cylindrical shape. However, other shapes are possible. For example, it could have a polygonal cross-section, The spacer is conveniently of area less that half of the area of the substrate and/or sensor element. Preferably, the spacer area is less than 30% of the area of the substrate and/or sensor element.

The spacer preferably spaces the substrate and sensor element apart by a distance in the region of 30 μm. However, the invention is also applicable to other arrangements in which the spacing is, for example, greater. Indeed, a greater spacing such as in the region of, for example 300 μm, may be advantageous as it may attenuate stresses coupling across the spacer.

The sensor conveniently comprises a vibratory ring gyroscope. In such an arrangement, the sensor element conveniently comprises a part of a magnet assembly of the sensor. For example, it may comprise a lower pole piece of the magnet assembly. It will be appreciated, however, that the invention may be applied to other forms of sensor and, in such arrangements, the sensor element may be of other forms.

The invention will further be described, by way of example, with reference to the accompanying drawings, in which:

FIG. 4 is a graph similar to FIG. 3 showing the quadrature bias variation of samples of a sensor in accordance with an embodiment of the invention.

Figure 1:
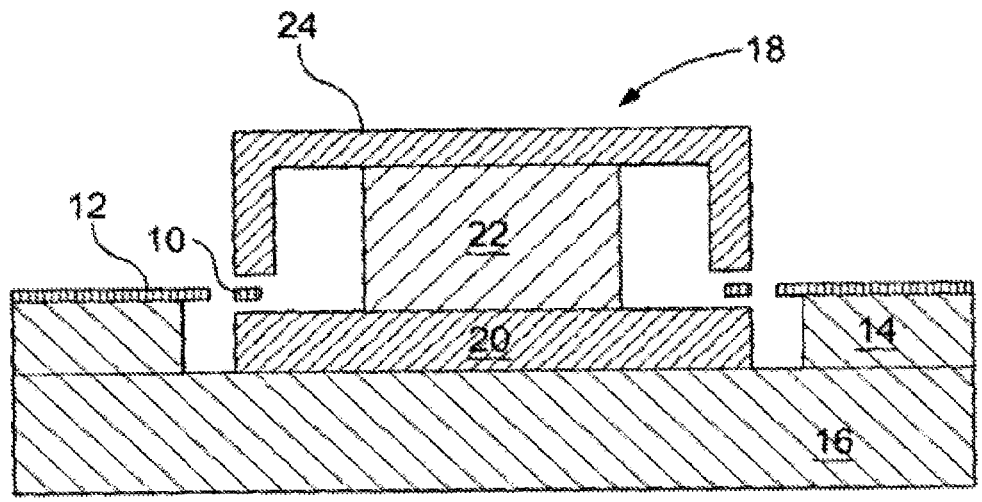
FIG. 1 is a diagrammatic representation of a known form of vibratory ring gyroscope.

Referring firstly to FIG. 1, a sensor is illustrated which comprises a ring shaped resonator 10 attached to a support frame 12 by integral support ligaments (not shown in FIG. 1) that extend outwards from the resonator 10. The support frame 12 is mounted upon a glass pedestal 14 which, in turn, is mounted upon a glass substrate 16.

Attached to the substrate 16 is a magnet assembly 18 made up of a lower pole piece 20, an upper pole piece 24, and a magnet 22 located therebetween. The magnet assembly 18, in particular the lower pole piece 20 thereof, is attached to the glass substrate 16 by a thin, substantially rigid layer of adhesive located between the lower pole piece 20 and the glass substrate 16. The lower pole piece 20 is thus secured, over its entire lower surface, to the substrate 16. The lower pole piece 20 is typically of a suitable ferromagnetic material which has a relatively low coefficient of thermal expansion. The pole piece 20 may have a coefficient of thermal expansion of the order of $7 \times 10^{-6}$. The coefficients of thermal expansion of silicon and Pyrex glass are in the region of $3 \times 10^{-6}$ and $2 \times 10^{-6}$, respectively. Typically, the adhesive is applied at an elevated temperature, for example in the region of 130° C. As the assembly cools from this temperature, differential thermal expansion/contraction occurs between the lower pole piece 20 and the substrate 16, inducing stresses therein and in the resonator 10 and support frame 12 as mentioned hereinbefore. Temperature changes during use will also induce stresses for the same reason.

This form of sensor is well known and so the manner in which it operates will not be described herein. For example, sensors of this general type are described in GB2322196 and US2011/0167911.

The support frame 12, pedestal 14 and substrate 16 are typically of generally square cross-sectional shape, the pedestal 14 including an inner opening of generally circular cross-sectional shape within which the magnet assembly 18, which is of generally cylindrical shape, is located. As a result, the stress distribution within the sensor is non-uniform, having maxima where the width of the pedestal 14 is smallest, and minima at the corners where the width of the pedestal 14 is greatest. This varying stress pattern is coupled into the resonator 10 through the ligaments by which it is mounted to the support frame 12, varying the stiffness of the resonator.

Figure 3:
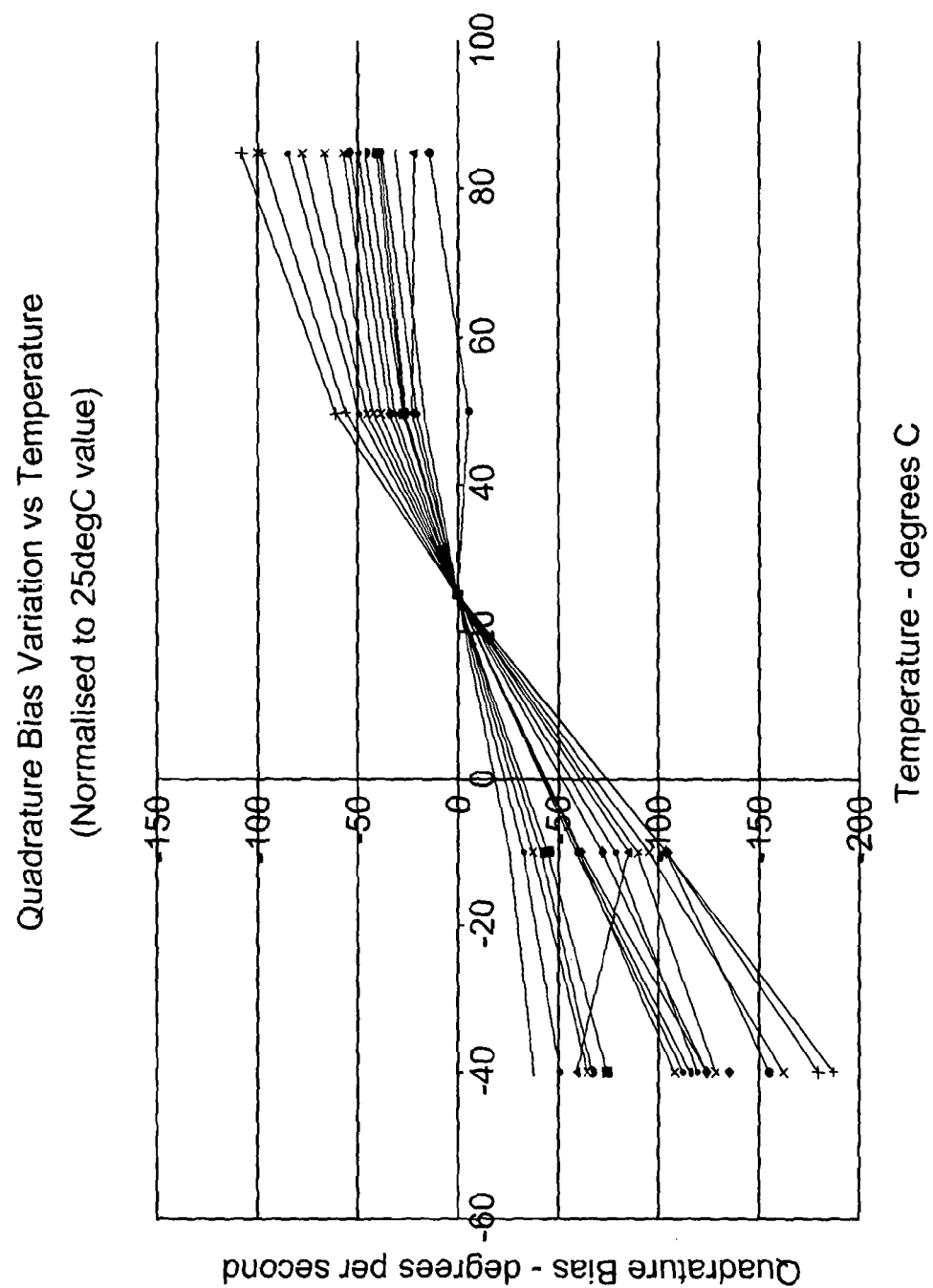
FIG. 3 is a graph illustrating the quadrature bias variation with temperature for thirty samples of a typical sensor.

It will be appreciated by one skilled in the art that the coupling of this varying stress pattern into the resonator impacts upon the operation of the sensor. The applicant believes that variations arising from these thermally induced stresses are the primary cause of quadrature bias variations, as would be understood by a man skilled in the art. FIG. 3 is a graph illustrating quadrature bias variations resulting from temperature changes, and it will be appreciated that these are quite significant, and so will impact upon the use of the sensor.

Figure 2:
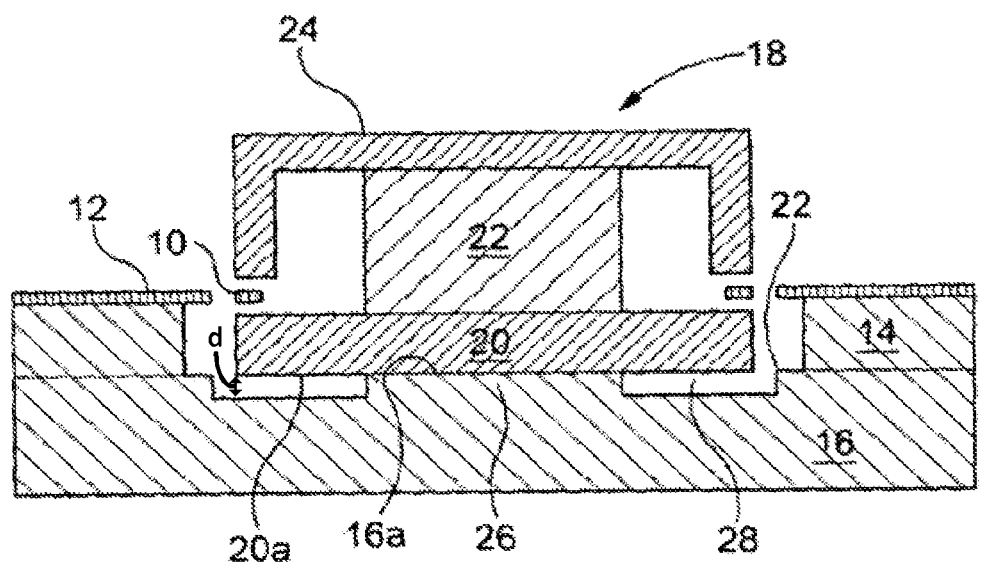
FIG. 2 is a view similar to FIG. 1 but illustrating a sensor in accordance with one embodiment of the invention.

FIG. 2 illustrates a sensor in accordance with an embodiment of the invention. The sensor of FIG. 2 is very similar to that of FIG. 1 and so only the differences therebetween will be described in detail below. Where appropriate, the description hereinbefore can be referred to to aid understanding of the embodiment of FIG. 2. Like reference numerals are used in FIGS. 1 and 2 to denote parts which are similar or perform substantially the same function.

In the sensor of FIG. 2, the underside or lower face 20a of the lower pole piece 20 does not engage the substrate 16 over substantially its complete area. Rather, the majority of the lower face 20a is spaced apart from the substrate 16 by a small distance d. Distance d may, for example, be of the order of 30 μm. As illustrated, this is achieved by virtue of the presence of a spacer 26. In the embodiment of FIG. 2, the spacer 26 is integrally formed with the substrate 16. However, arrangements may be possible in which the spacer 26 forms part of the lower pole piece 20, or is a separate component. Furthermore, the spacer could be of two part form, part of the spacer being formed on the substrate and another part thereof being formed on the lower pole piece.

Whilst in the arrangement described hereinbefore the distance d is of the order of 30 μm, it will be appreciated that other spacings may be used without departing from the scope of the invention. Indeed, greater spacings such as, for example, 300 μm, may be advantageous as they may result in some attenuation of the stresses coupling across the spacer. To some extent, the depth will be governed by the technique used to form the spacer and the structural integrity of the spacer and the remainder of the substrate.

The spacer 26 is conveniently formed by etching a shallow recess or cavity 28 into a surface 16a of the substrate 16. Other manufacturing techniques may be used. For example, powder blasting techniques may be used. Typically, etching will result in the formation of a relatively shallow recess, powder blasting being appropriate where a deeper recess is desired. The recess or cavity 28 is of generally annular form, having an outer diameter slightly larger than the diameter of the lower pole piece 20; the spacer 26 being formed or defined by the centre of the annular recess or cavity 28. The spacer 26 thus projects from the centre of the recess or cavity 28 to substantially the plane of the surface 16a.

As with the sensor of FIG. 1, during assembly, the lower pole piece 20 is secured to the substrate 16, for example by the use of a suitable epoxy. Unlike the sensor of FIG. 1, however, only part of the lower face 20a of the lower pole piece 20 is fixed to the substrate 16, the said part of the lower face 20a being fixed to the spacer 26. The remainder of the lower face 20a of the lower pole piece 20 is suspended or spaced from the substrate 16 by virtue of the presence of the recess or cavity 28 and the spacer 26. The area of contact between the sensor element 20 and the substrate 16 is this limited to the area of the spacer 26.

As only a relatively small part of the surface area of the lower pole piece 20 is in contact with, and secured to, the substrate 16, it will be appreciated that differential thermal expansion or contraction only results in the imparting or inducing of limited stresses into the assembly. Coupling of thermally induced stresses into the resonator 10 is thus much reduced, leading to enhancements in the operation and sensitivity of the sensor.

By way of example, in the arrangement illustrated, the lower pole piece 20 is of diameter approximately 6 mm, the recess or cavity is slightly larger than the pole piece 20, and the spacer 26 is of diameter approximately 3 mm. It will be appreciated, therefore, that in this embodiment the area of contact between the lower pole piece 20 and the substrate 16 (i.e. the area of the spacer 26) is approximately 25% of the equivalent contact area of the arrangement of FIG. 1. Whilst in this embodiment the contact area is reduced to 25% of the equivalent area of the arrangement of FIG. 1, it will be appreciated that the invention is not restricted in this regard. For example, some of the benefits of the invention would arise by reducing the contact area to less than, approximately, 50% of the area of the lower pole piece 20. However, preferably, the contact area is less than this, conveniently less than approximately 30% of the area of the lower pole piece 20. It will be appreciated that, in practise, there is a trade-off between minimising the contact area to reduce the coupling of thermally induced stresses into the resonator 10, and ensuring that the lower pole piece 20 is properly supported and secured in position an the substrate 16.

FIG. 4 is a graph similar to FIG. 3, and to substantially the same scale, but illustrating the quadrature bias variations of the embodiment of FIG. 2 as described hereinbefore. It will be noted, by comparing the graphs of FIGS. 3 and 4, that the quadrature bias variations with temperature of the arrangement of FIG. 2 are much reduced.

The arrangement of the invention not only achieves a reduction in the coupling of thermally induced stresses into the resonator, and so reduces the negative effects thereof, but also achieves this result in a relatively simple and convenient manner, involving the introduction of just a single additional manufacturing step to form the cavity 28.

In the arrangements described hereinbefore, the lower pole piece 20 forms the sensor element which is secured to the substrate 16. However, it will be appreciated that in other forms of sensor, the sensor element may take other forms. The invention is not restricted in this regard.

A wide range of modifications and alterations may be made to the arrangements described hereinbefore without departing from the scope of the invention as defined by the appended claims. For example, in the arrangement described the spacer 26 is formed at the centre of the recess or cavity 26 and is of generally cylindrical form. However, other shapes and locations could be employed, if desired.

The invention claimed is:

1. A sensor comprising a substrate and a sensor element anchored to the substrate,
   the substrate and sensor element being of dissimilar materials and having different coefficients of thermal expansion,
   the sensor element and substrate each having a generally planar face arranged substantially parallel to one another,
   the sensor further comprising a single spacer defined by a projection upstanding from a surrounding part of the substrate and whereby the sensor element is anchored upon the substrate,
   wherein the spacer comprises a vertical side,
   the spacer being located so as to space at least part of the sensor element from at least part of the substrate,
   wherein the face of the spacer comprises a smaller area than the face of the substrate and the sensor element, the smaller area comprising less than half of the area of the face of the substrate and less than half of the area of the face of the sensor element,
   wherein the sensor element comprises a magnet assembly comprising:
   a lower pole piece;
   an upper pole piece; and
   a magnet located therebetween and comprising a vertical side,
   wherein the vertical side of the magnet is aligned with the vertical side of the spacer, and
   the lower pole piece extends beyond the vertical side of the spacer and the vertical side of the magnet and over a cavity formed in the face of the substrate
   wherein the lower pole piece is directly anchored to the spacer.

2. A sensor according to claim 1, wherein the spacer is formed integrally with the sensor element.

3. A sensor according to claim 1, wherein the spacer is formed integrally with the substrate, and is bonded to the sensor element.

4. A sensor according to claim 3,
   wherein the face of the spacer is of area less than 30 percent of the area of the face of the substrate and is of area less than 30 percent of the area of the face of the sensor element, and
   wherein the spacer spaces the substrate and sensor element apart by a distance comprising at least 30 microns.

5. A sensor according to claim 4, wherein the spacer is upstanding from a base of the cavity.

6. A sensor according to claim 5, wherein the projection is located at the center of the cavity.

7. A sensor according to claim 6, wherein the cavity is of annular form.

8. A sensor according to claim 6, wherein the projection is of generally cylindrical shape.

9. A sensor according to claim 1, wherein the face of the spacer is of area less than 30 percent of the area of the face of the substrate and less than 30 percent of the area of the face of the sensor element.

10. A sensor according to claim 1, wherein the spacer spaces the substrate and sensor element apart by a distance comprising at least 30 microns.

11. A sensor according to claim 1, and comprising a vibratory ring gyroscope.

12. A sensor according to claim 1, wherein the spacer has a generally planar face arranged substantially parallel to the face of the sensor element and the face of the substrate, the face of the spacer being substantially in the plane of the face of the substrate.

* * * * *